(12) United States Patent
Birner et al.

(10) Patent No.: US 6,861,312 B2
(45) Date of Patent: Mar. 1, 2005

(54) METHOD FOR FABRICATING A TRENCH STRUCTURE

(75) Inventors: Albert Birner, Dresden (DE); Matthias Goldbach, Dresden (DE); Joern Luetzen, Dresden (DE)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 10/233,969

(22) Filed: Sep. 3, 2002

(65) Prior Publication Data

US 2003/0045052 A1 Mar. 6, 2003

(30) Foreign Application Priority Data

Aug. 31, 2001 (DE) .......................................... 101 42 591

(51) Int. Cl.$^7$ ......................................... H01L 21/8242
(52) U.S. Cl. ..................................... 438/243; 438/249
(58) Field of Search ........................................ 438/243

(56) References Cited

U.S. PATENT DOCUMENTS

| | | | | |
|---|---|---|---|---|
| 6,150,210 A | * | 11/2000 | Arnold ......................... | 438/243 |
| 6,190,988 B1 | * | 2/2001 | Furukawa et al. ........... | 438/386 |
| 6,541,817 B1 | * | 4/2003 | Hurkz et al. ................. | 257/330 |
| 6,599,798 B2 | * | 7/2003 | Tews et al. .................. | 438/249 |

FOREIGN PATENT DOCUMENTS

| | | |
|---|---|---|
| DE | 100 29 036 C1 | 8/2001 |
| DE | 100 30 696 A1 | 1/2002 |

* cited by examiner

*Primary Examiner*—David Nelms
*Assistant Examiner*—Thao P. Le
(74) *Attorney, Agent, or Firm*—Laurence A. Greenberg; Werner H. Stemer; Ralph E. Locher

(57) ABSTRACT

An insulation region, for example, an oxide collar, is formed in a trench structure for a DRAM by first widening a first trench region of the trench that is to be formed, in particular, a base region thereof. At least part of the widened region is then provided with a material region for the insulation region.

26 Claims, 10 Drawing Sheets

METHOD FOR FABRICATING A TRENCH STRUCTURE

BACKGROUND OF THE INVENTION

Field of the Invention

The invention relates to a method for fabricating a trench structure for a semiconductor circuit configuration, in particular, for an integrated semiconductor memory device, a DRAM, or the like.

To form integrated semiconductor circuit configurations, in particular, semiconductor memory devices, DRAMs, or the like, the circuit elements and conducting devices that are required are formed as different material regions and/or layers in a semiconductor substrate or the like. In such a context, it is often necessary to form insulation regions in trenches or trench structures that are to be provided in the region of the semiconductor substrate or the like, which insulation regions are in each case produced, for example, as what are referred to as oxide collars in the walls of the trenches or in regions thereof. These insulation regions or collar regions are used for electrical insulation and/or field screening of certain substantially adjacent material regions of the semiconductor substrate or the like.

To fabricate the corresponding trench structures, at least one trench, which at least, in part, extends substantially vertically with respect to a semiconductor substrate or the like, is formed in the semiconductor substrate, with at least a first wall region and/or a second wall region or the like. Furthermore, for such a purpose, the corresponding insulation region is formed in the region of the first and/or second wall region and/or as part thereof.

A problem of conventional methods for fabricating a trench structure is that the insulation regions or collar regions are produced after the corresponding trenches have actually been formed or etched in the semiconductor substrate or the like. Such a procedure is disadvantageous, in particular, because a high level of mechanical and production technology outlay is required to align the successive processes.

SUMMARY OF THE INVENTION

It is accordingly an object of the invention to provide a method for fabricating a trench structure for a semiconductor circuit configuration that overcomes the hereinafore-mentioned disadvantages of the heretofore-known devices and methods of this general type and that forms insulation regions to be provided therein in a particularly reliable yet simple way.

With the foregoing and other objects in view, there is provided, in accordance with the invention, a method for fabricating a trench structure for a semiconductor circuit configuration, including the steps of forming in the semiconductor substrate at least one trench extending at least in part substantially vertically with respect to the semiconductor substrate, the trench having a first wall region and forming an insulation region at least one of in a region of the first wall region and as part of the first wall region by first forming at least one widened region by widening a section of the trench to be formed and subsequently forming a material region having a substantially electrically insulating material for the insulation region at least in part of the widened region.

The method according to the invention for fabricating a trench structure for a semiconductor circuit configuration, in particular, for an integrated semiconductor memory device, a DRAM, or the like, is characterized in that to form the insulation region, first of all a region of the trench that is to be formed, in particular, a temporary base region, the first and/or second wall regions thereof or the like, is widened by forming at least one widened region, and in that then, to form the insulation region, a material region including a substantially electrically insulating material for the insulation region is formed at least in part of the widened region.

Therefore, a basic idea of the present invention is to integrate the insulation region that is to be provided in each case, i.e., in particular, a collar region, in the production process for a trench structure by, first of all, widening a region of the trench that is to be formed and then providing it with a material region. The region of the trench that is to be formed is, in particular, a first trench section, a base region, which may if appropriate be temporary, a first and/or second wall region thereof. In particular, it is provided that the first region of the trench that is to be formed per se is formed, and is then immediately widened appropriately before the trench structure as a whole is completed. Therefore, an advantage over the prior art is that the trench structure, i.e., in particular, the trench, is respectively not completely structured before the insulation region is formed in the region of the trench. Therefore, subsequent or deeper regions or sections of the trench that is to be formed remain substantially unaffected by the formation of the widened region and of the insulation region, and the alignment and protection mechanisms that are to be provided in the prior art can be dispensed with.

In accordance with another mode of the invention, the widening takes place substantially isotropically and/or anisotropically in part in wet-chemical form, preferably, using a substantially alkaline etching medium, and/or at least in part in dry-chemical form.

When isotropic and/or nonselective etching processes are used to form the widening, it is advantageous for a protective region to be formed on regions, in particular, of the trench, which are not to be widened, prior to the widening. This protects regions that are not to be patterned during the formation of the widenings.

In such a case it is provided, in particular, that the protective region is formed by substantially two-dimensional, conformal deposition over much and/or all of the surface, in particular, using a SiN layer or the like.

Furthermore, in accordance with a further mode of the invention, the material region for the insulation region is formed at least in part by deposition. This is achieved, in particular, by a CVD process or the like. Alternatively or in addition, the material region for the insulation region may also be formed by selective deposition or the like, in particular, by deposition of silicon dioxide on silicon and/or on silicon dioxide, but not on silicon nitride. This is achieved, in particular, by what is referred to as a selox process or the like.

Instead of the active deposition of a material region to form the insulation region, in accordance with an added mode of the invention, it is additionally or alternatively possible for the material region for the insulation region to be formed at least in part by a chemical reaction or the like in the widened region. Etching a layer of microporous silicon and then partially oxidizing it, for example, can achieve such formation. This means that the material that is present in the widened region, for example, at the walls or at the base region or the like, is chemically converted, for example, as a result of a suitable etching medium being introduced temporarily into the widened region, in order to initiate and carry out the conversion operation. In such a case, the protective region is then very advantageously suitable for protecting those regions of the trench that is to be formed from a corresponding chemical conversion, so that material for the insulation region is produced exclusively in the widened region, in a defined way.

It is particularly advantageous if, in order to form the insulation region, thermal oxidation of the semiconductor material, in particular, of the silicon and/or, in particular, as part of a LOCOS process, is generated locally.

In accordance with an additional mode of the invention, to form the trench, first of all, in each case a first trench section is formed in the semiconductor substrate or the like, in particular, by a first, substantially anisotropic etching step, in which, in particular, a temporary base region is formed.

In accordance with yet another mode of the invention, if appropriate, the protective region is formed, in particular, covering wall and/or base regions of the first trench section.

In accordance with yet a further mode of the invention, then, the widened region is formed in the region of the temporary base region and/or below it as a second trench section, the protective region, if appropriate, being removed beforehand at least at the base region, in particular, by a substantially anisotropic second etching step.

In accordance with a concomitant mode of the invention, then, the corresponding insulation region is formed, and then, if appropriate, a third trench section, which adjoins the second trench section, is formed, in particular, by an anisotropic third etching step.

The latter procedure leads to the trench of the trench structure, unlike in the prior art, being formed substantially in three patterning sub-steps. A first trench section is defined and formed in advance, indicating the basic structure and the position of the trench. Then, the insulation region is formed as a widened region and a second trench section. Finally, if appropriate, the formation of the trench is completed by forming a third trench section.

Such a temporal sequence and the selectivity of the processes with respect to one another makes special outlay involved in ensuring that the individual trench sections are aligned with respect to one another and that the collar region and insulation region are aligned with respect to the trench sections simple, unlike in the prior art.

In the text that follows, and also in the above text, the term semiconductor substrate is to be understood in as broad a sense as possible. Therefore, it is understood as meaning not only a material region of an actual semiconductor, but also corresponding doped regions, protective regions, passivation regions or the like, i.e., the term substantially means the wafer material.

The following comments explain the aspects of the present invention that have been listed above and further aspects.

The inventive integration concept for constructing trench structures or deep trenches as described above results in a process sequence that is recess-free, self-aligning with respect to the collar region in the doping, and inexpensive. Insulation regions, oxide collars, or collar regions that are required are produced before or during the trench-etching processes.

In particular, it is advantageous for the insulation region or collar region to be formed as a buried structure, in particular, in the trench side wall, in bulk silicon.

Hitherto, the standard collar process (STC) and the buried plate self-aligned (CVD) collar process (BPC) have been described as concepts for forming trench structures for semiconductor circuit configurations.

In the STC process, first of all, the trench capacitance is completed, i.e., buried plate, node dielectric, and polysilicon filling are formed. Then, the trench capacitor or the polysilicon filling is partially removed again to introduce the collar or insulation region.

In the BPC process, the insulation region or collar region is formed after the formation or etching of the trench or deep trench using a dummy polysilicon filling.

The inventive concept proposed, on the other hand, provides for the formation of the insulation region or collar region to be integrated, in terms of the process and in terms of time, in the etching process for the trench or for the deep trench, specifically, by interrupting the etching process, in particular, twice.

In detail, the process sequence provides for the region of the buried strap to be provided with a protection during the etching operation for the deep trench, for example, with a SiN liner or the like. Then, a second depth is defined by an Si etch. This depth is then widened isotropically and/or anisotropically, which can be carried out, for example, by a wet-chemical process, if appropriate using an alkaline etching medium. As an alternative or in addition, a dry-chemical treatment is also possible. Then, an oxide is produced, which then forms the oxide collar region or insulation region. A CVD process may be suitable for such a purpose. Alternatively, selective deposition of $SiO_2$ on $Si/SiO_2$ but not on SiN (selox process) is also possible. A third alternative is to etch a microporous Si layer, which is then partially oxidized (referred to as the MIPSI process). The LOCOS process, i.e., the selective local thermal oxidation of silicon, is also particularly advantageous.

Then, the oxide is removed by anisotropic oxide etching so that only the collar region or insulation region remains in place. In the case of the selox process, the MIPSI process, and the LOCOS process, it is not necessary to etch clear the oxide on the surface and in the upper trench region.

Then, the etching of the trench or deep trench is completed, specifically, by forming a suitable third trench section. Then, the doping of the buried plate can take place in self-aligned fashion through the protective region that has been formed for the first trench section or buried strap and through the insulation region or collar region. Then, the filling of the trench or deep trench with dielectric and/or electrode material is carried out. Because the collar region has been produced, all that is then required is a recess for the buried strap. The SiN is removed here, and, then, the procedure continues in accordance with the STC/BPC process.

Overall, by way of example, the following advantages result from the method according to the invention compared to conventional procedures:

a) the doping of the buried plate is self-aligned on the collar region;

b) the formation of a recess for the collar region and the removal of corresponding polysilicon layers, which are required in the BPC process, are eliminated;

c) the diameter of the trench after the collar region has been formed is not limited by this region, unlike in the BPC process. This makes it easier to introduce the polysilicon filling and, on account of a greater layer thickness, reduces the corresponding low series resistance;

d) unlike in the STC process, alignment of recesses is not required;

e) unlike in the STC/BPC process, it is not necessary to deposit and/or remove dummy layers in the region below the collar region;

f) there is no need to use a safety margin with regard to the thickness of the insulation region or collar region, unlike in the BPC process, in which losses occur during the removal of the corresponding liner for the dummy filling;

g) the pad oxide below the pad-nitride breakthrough region of the trench or deep trench is protected by the nitride liner. This results in an improved chemicals resistance, and, in particular, pad oxide can no longer be removed, in particular, during the LOCOS process. Furthermore, the formation of what is referred to as a bird peck in the region of the pad oxide is suppressed at an early stage;

h) the process sequence is compatible with measures that increase the surface area, such as the wet bottle, HSG, mesopore, micromasking processes, or the like; and i) the process complexity of the proposed method is lower than in the prior art.

A basic idea of the present invention resides in the possibility of integrating the insulation region in the etching step for the trench.

Other features that are considered as characteristic for the invention are set forth in the appended claims.

Although the invention is illustrated and described herein as embodied in a method for fabricating a trench structure, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
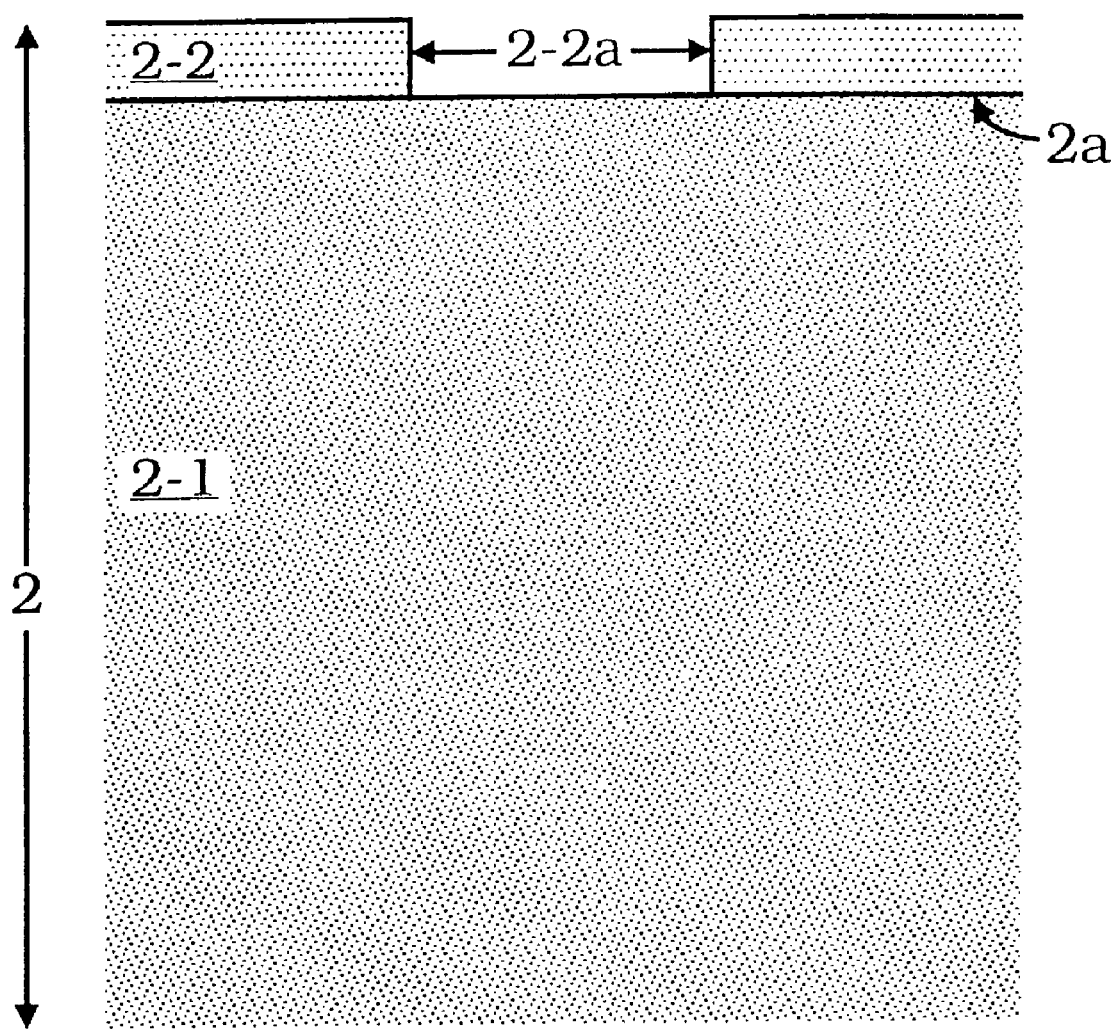
FIGS. 1 to 10 are fragmentary, cross-sectional views of intermediate stages in the fabrication of a trench structure for a semiconductor circuit configuration obtained using an embodiment of the method according to the invention.

Referring now to the figures of the drawings in detail and first, particularly to FIG. 1 thereof, there is shown a diagrammatic, cross-sectional view of the basic state of the starting point for the exemplary embodiment of the inventive fabrication method illustrated in FIGS. 1 to 8. FIG. 1 shows a semiconductor substrate 2 that has a multilayer structure with a first layer 2-1 and a second layer 2-2, the first layer 2-1 representing the actual semiconductor substrate 2-1, which is covered by a hard-mask layer 2-2 with the recess 2-2a as the second layer or etching mask. The position of the mask recess determines the position of the trench structure that is to be formed. Each of the first and second layers 2-1 and 2-2 may, in turn, be of different material regions or material layers.

Figure 2:
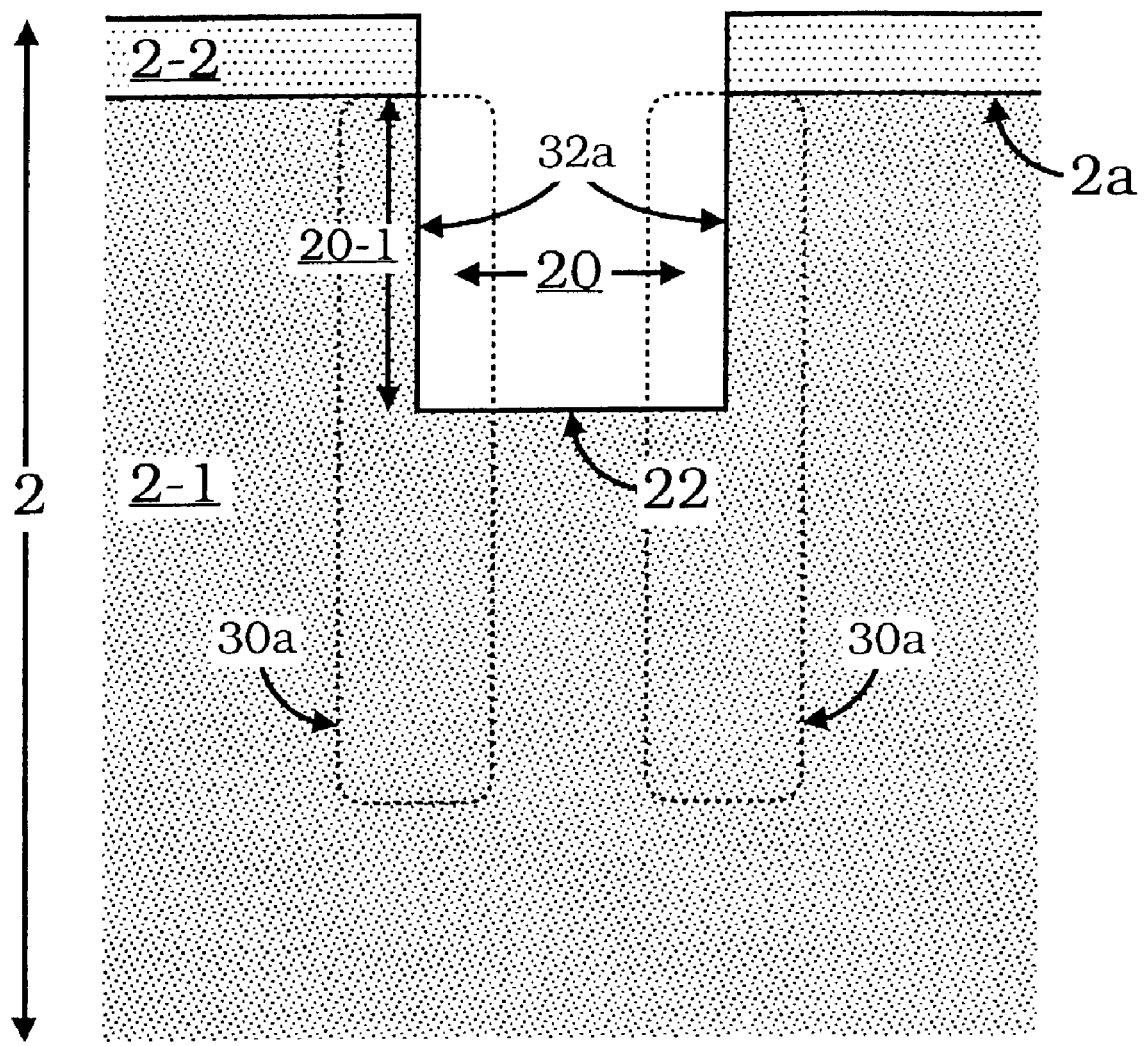

In the transition to the intermediate state that is shown in FIG. 2, likewise in a diagrammatic and cross-sectional view, a first trench section 20-1 is introduced into the semiconductor material 2-1, starting from the surface 2a of the semiconductor material 2-1, in a first anisotropic etching step, which trench section defines the position and profile of first and second edge regions or wall regions 30a with first and second walls 32a and 32b of the trench 20 that is to be formed. The depth of the first trench section 20-1 also forms a corresponding temporary base region 22.

Figure 3:
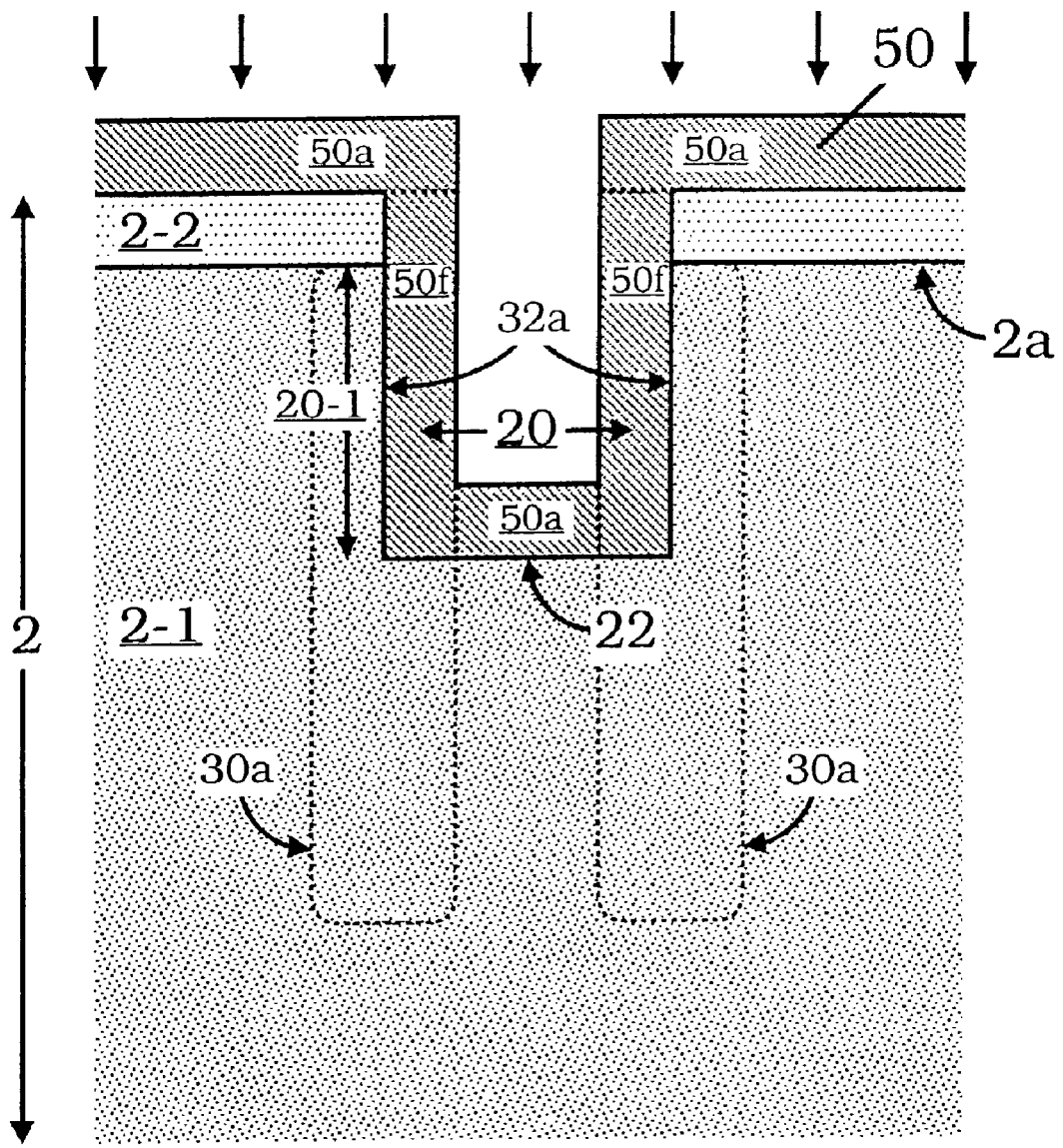

Then, in the transition to the intermediate state shown in FIG. 3, a material layer for a protection region 50 is deposited two-dimensionally and conformally such that the surface 2a of the mask substrate 2-2, of the upper walls 32a of the first trench section 20-1 or of the trench 20 and of the corresponding base region 22 is covered. Then, an anisotropic etching step is carried out, indicated by the directional arrows in FIG. 3.

Figure 4:
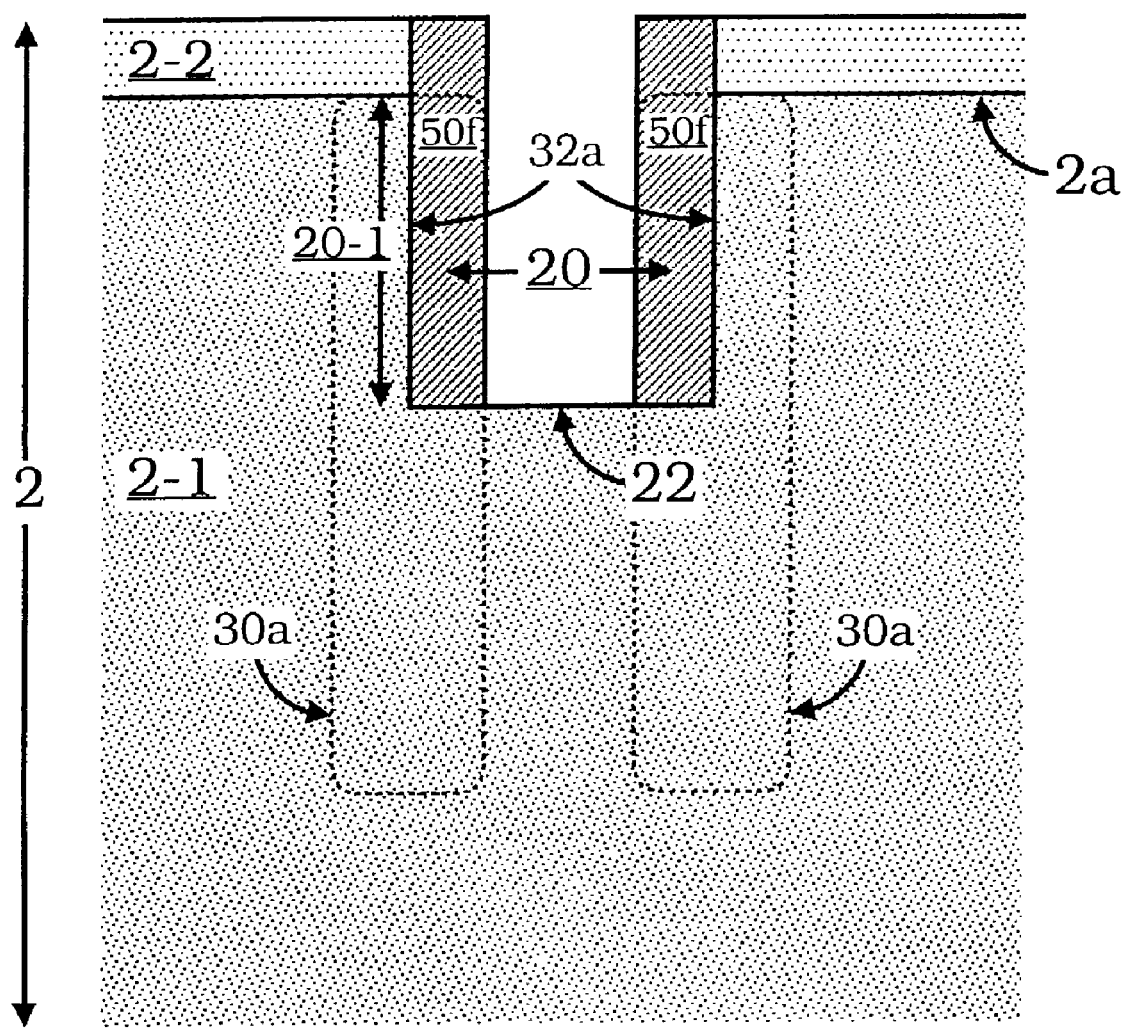

FIG. 4 shows a diagrammatic and cross-sectional view of the intermediate state after the first anisotropic etching step has taken place, by which the substantially laterally extending sections 50a (see FIG. 3) of the protective region 50 have been removed from the base region 22 of the trench 20 and from the surface region 2a of the semiconductor substrate 2. Now, all that remains is substantially vertically extending material regions 50f of the protective region 50, as shown in FIG. 4.

Figure 5:
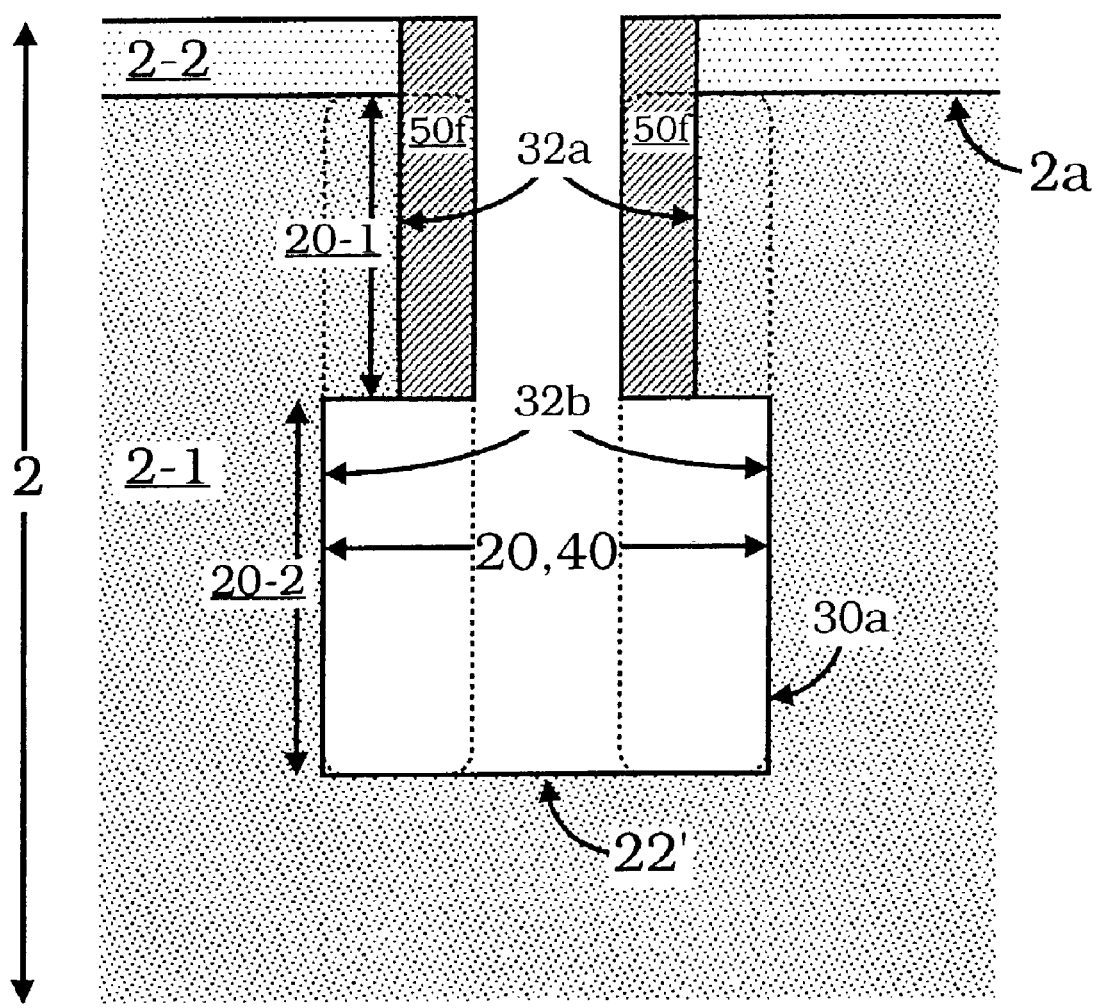

Then, in the transition to the intermediate state shown in FIG. 5, a suitable etching medium is fed into the first trench section 20-1 such that anisotropic etching deepens the trench. Then, a wet/dry chemical process recesses the newly etched trench region. FIG. 5 shows the result of this wet-chemical etching step, in which a widened region 40 and, therefore, a second trench section 20-2 of the trench 20 with second or middle walls 32b are produced, specifically, in an isotropic and/or anisotropic manner. A temporary base region 22' is formed.

Figure 6:
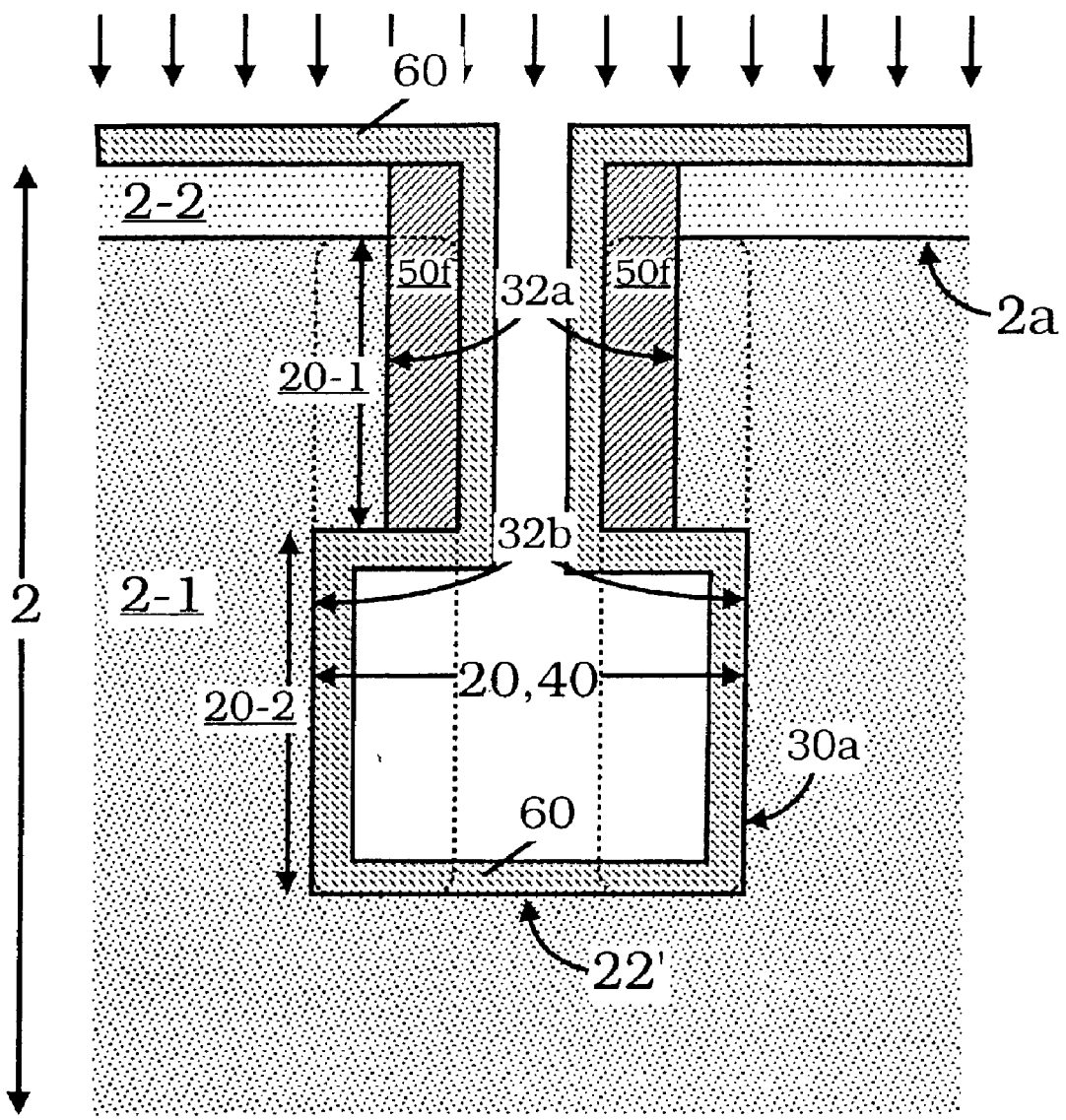

Then, in the transition to the intermediate state shown in FIG. 6, a suitable material 60 for the insulation region 60f is formed substantially conformally or anisotropically. As a result, the widened region 40 is lined, as shown in FIG. 6. This can take place by isotropic deposition or also by local thermal oxidation of the silicon or of the semiconductor substrate, in particular, by a LOCOS process.

Figure 7:
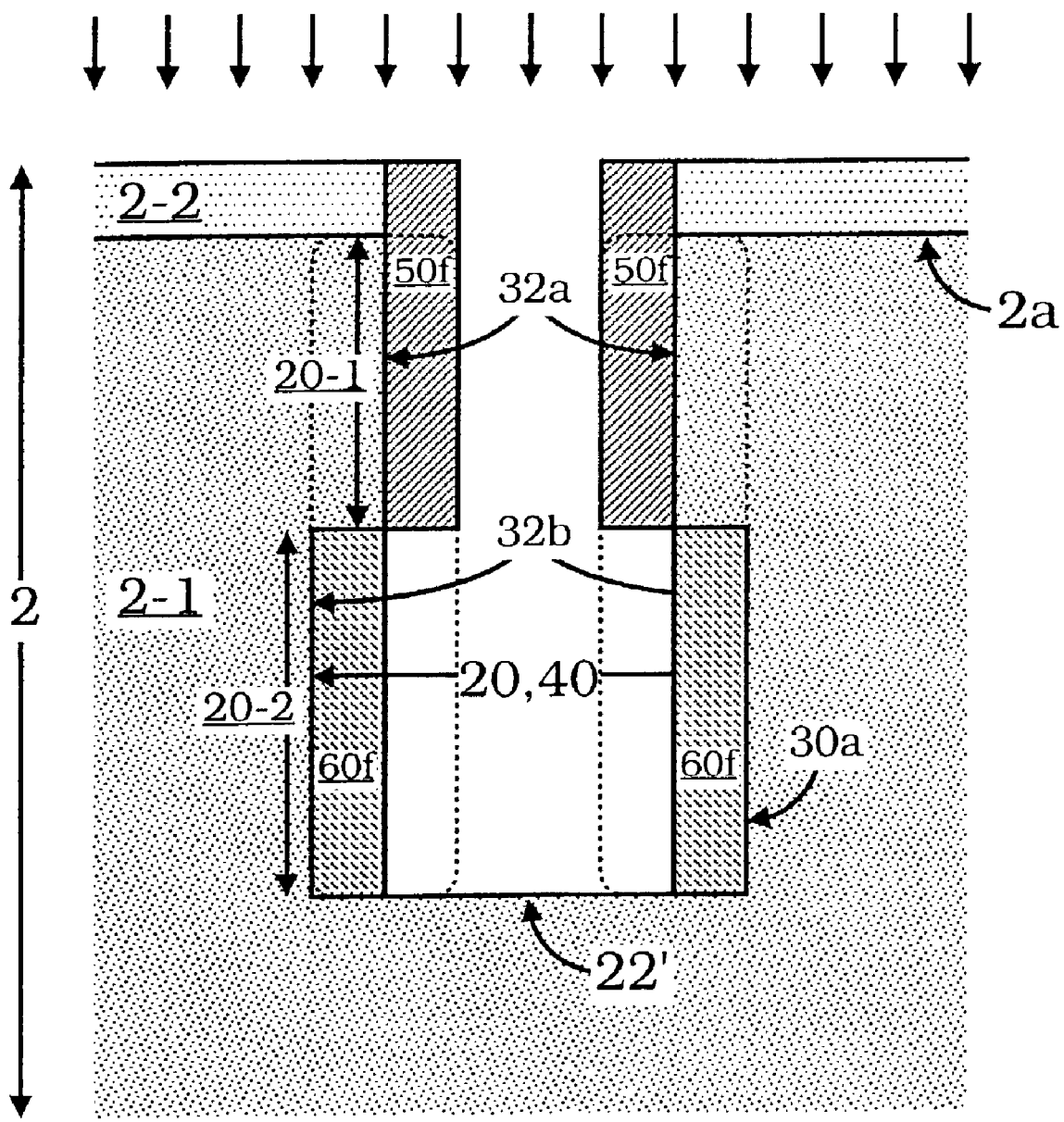

The laterally extending material regions for the insulation region are removed by a further anisotropic, i.e., directional etching step carried out as indicated by arrows in FIG. 6, so that, as illustrated in FIG. 7, only substantially vertically extending material regions 60f remain in place for the insulation region 60f.

Figure 8:
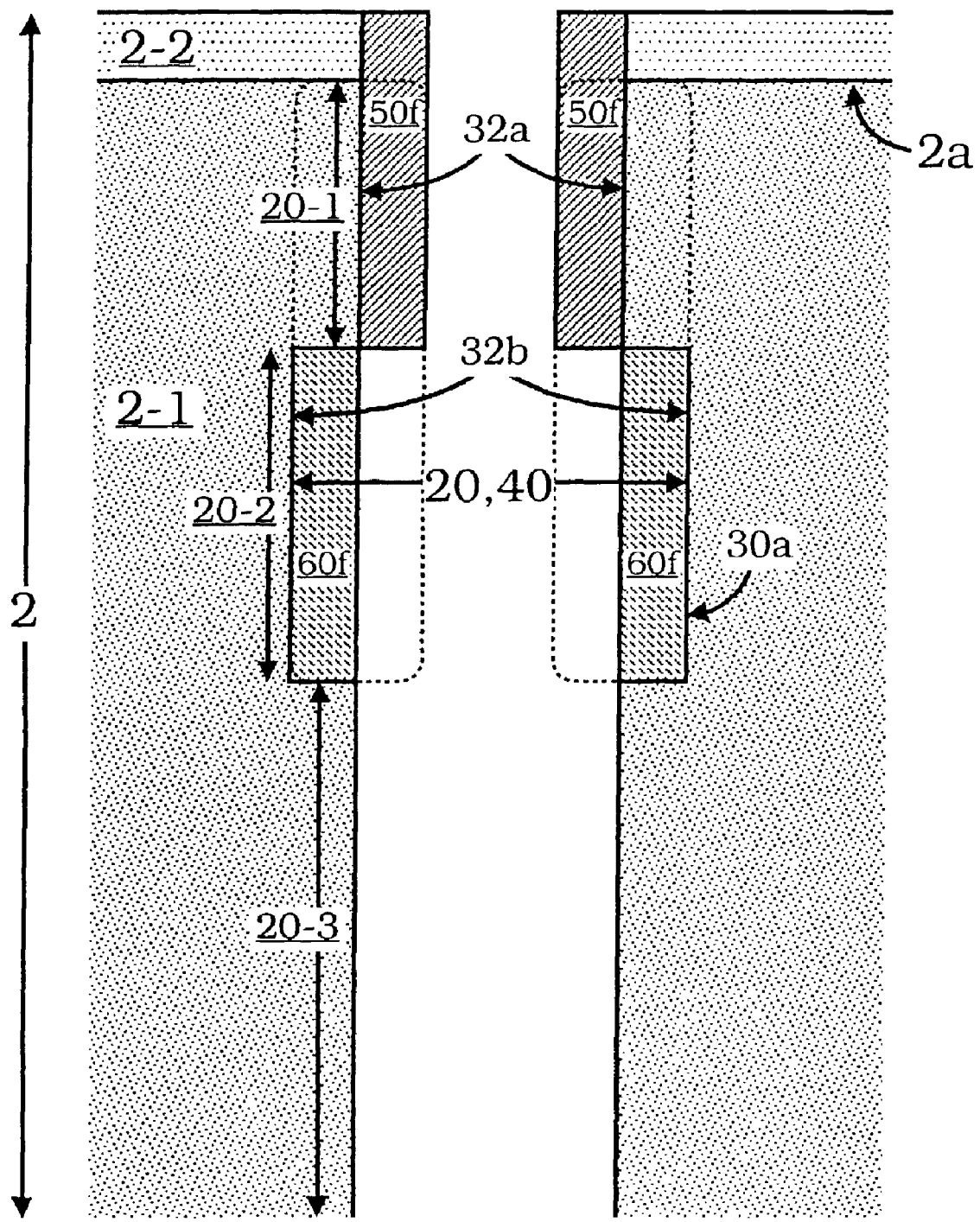

Then, in the transition to the state shown in FIG. 8, the third or lower trench section 20-3, namely the filled widened region 40, is made deeper in the vertically downward direction by a further anisotropic etching step, which is indicated by arrows in FIG. 7, with lower walls 32c, so that a third trench section 20-3 is produced. As such, the structure of the trench 20 is finally completed.

If appropriate, suitable doping and filling processes follow, by which corresponding circuit and/or conducting elements are formed in the region of the trench 20 and the trench structure 10.

Figure 9:
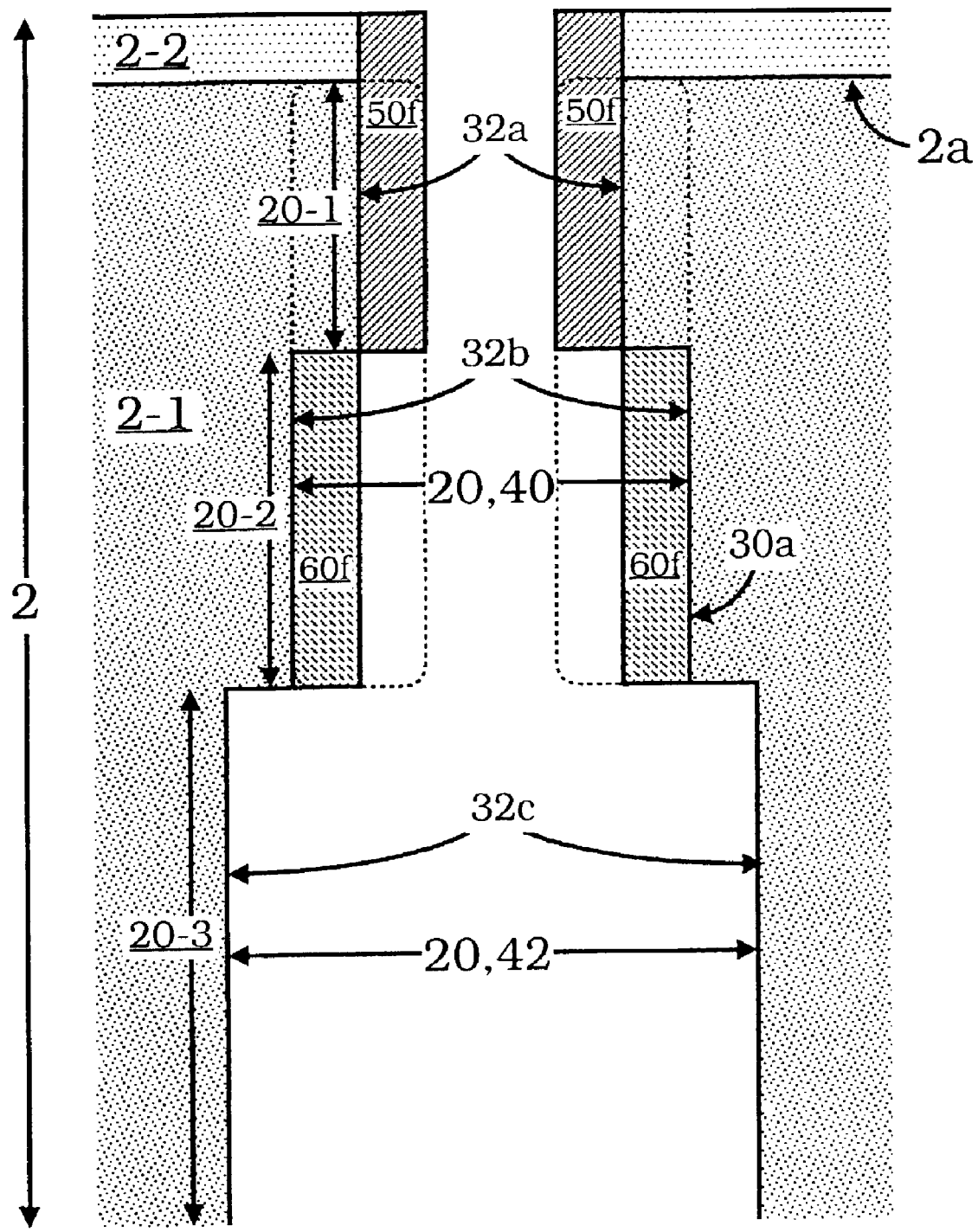

This is achieved, for example, by a lower widening process in the lower trench section 22-3 in order to form a widening 42 as shown in FIG. 9.

Figure 10:
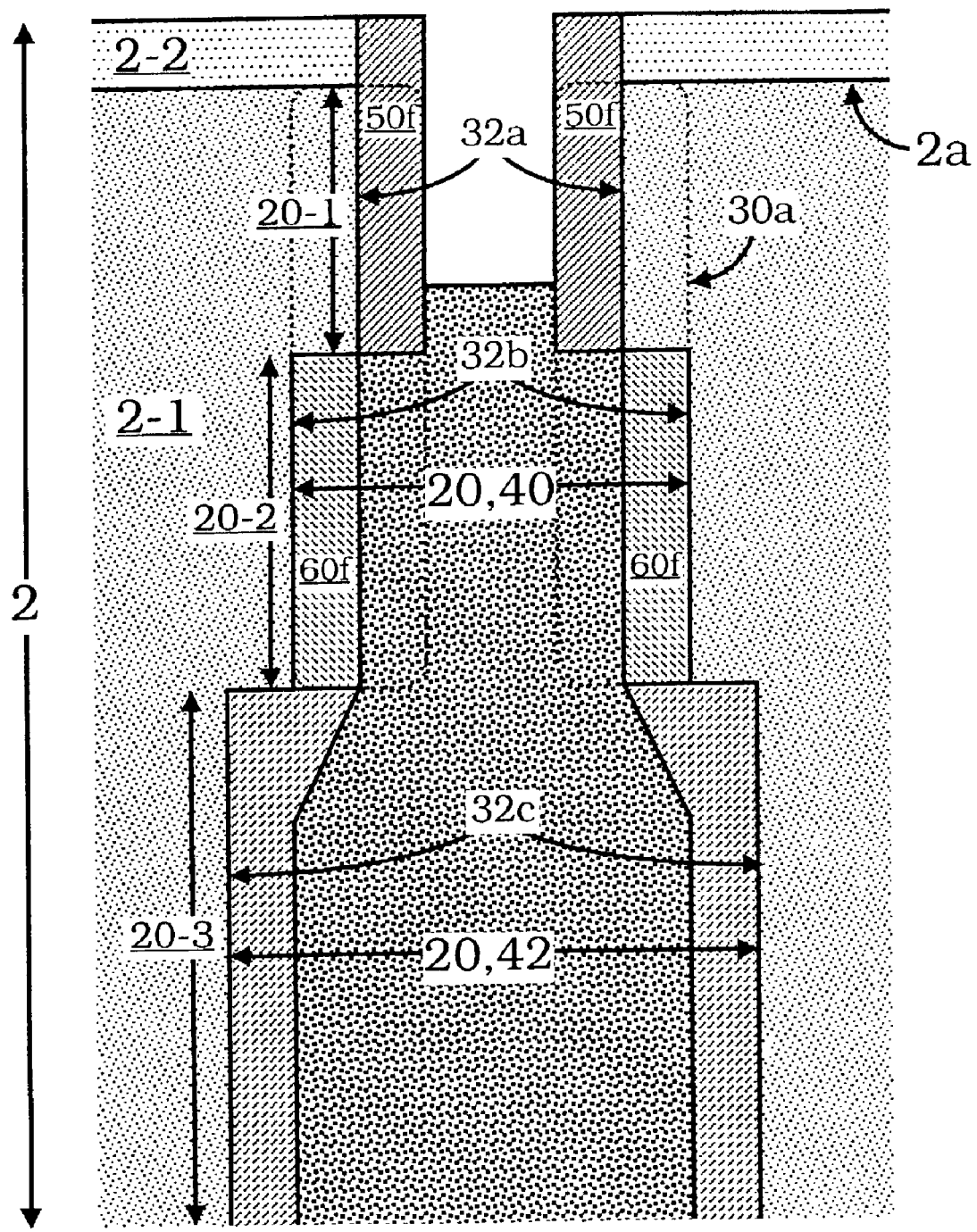

Then, filling, if appropriate multilayer filling, may take place, as shown in FIG. 10.

We claim:

1. A method for fabricating a trench structure for a semiconductor circuit configuration, which comprises:

forming in a semiconductor substrate at least one trench extending at least in part substantially vertically with respect to the semiconductor substrate, the trench having a wall, and first, second and third trench sections; and forming an insulation region at least one of:
in a region of the wall,
and as part of the wall by:
forming the first trench section in the semiconductor substrate, the first trench section having a first wall region of the wall and a first temporary base region;
forming a protective region on regions of the first trench section not to be widened;
subsequently forming a widened region as the second trench section in at least one of a region of the first temporary base region and below the region of the first temporary base region, the second trench section having a second wall region of the wall and a secondary base temporary region;
subsequently forming the insulation region in at least one of a region of the second wall region and as part of the second wall region from a substantially electrically insulating material;
subsequently forming the third trench section adjoining the second trench section in at least one of a region of the second temporary base region and below the region of the second temporary base region.

2. The method according to claim 1, which further comprises carrying out the widening step by widening at least one of the first temporary base region and the first wall region of the first trench section.

3. The method according to claim 1, which further comprises carrying out the widening step by at least one of substantially isotropic and substantially anisotropic etching.

4. The method according to claim 1, which further comprises carrying out the widening step by at least one of:
in part in wet-chemical form; and
in part in dry-chemical form.

5. The method according to claim 4, wherein the wet-chemical form is a substantially alkaline etching medium.

6. The method according to claim 1, which further comprises, before widening, forming the protective region on regions not to be widened.

7. The method according to claim 1, which further comprises, before widening, forming the protective region on regions of the trench not to be widened.

8. The method according to claim 6, which further comprises forming the protective region by substantially two-dimensional, conformal deposition over a significant portion of a surface of the semiconductor substrate.

9. The method according to claim 8, which further comprises carrying out the deposition by depositing a SiN layer.

10. The method according to claim 6, which further comprises forming the protective region by substantially two-dimensional, conformal deposition over all of a surface of the semiconductor substrate.

11. The method according to claim 10, which further comprises carrying out the deposition by depositing a SiN layer.

12. The method according to claim 1, which further comprises forming the insulation region at least in part by deposition.

13. The method according to claim 1, which further comprises forming the insulation region at least in part by a CVD process.

14. The method according to claim 1, which further comprises forming the insulation region at least in part by selective deposition.

15. The method according to claim 1, which further comprises forming the insulation region at least in part by selective deposition of at least one of $SiO_2$ on Si and $SiO_2$ on $SiO_2$ but not on SiN.

16. The method according to claim 1, which further comprises forming the insulation region at least in part by selective deposition of $SiO_2$ on $SiO_2$ but not on SiN using a selox process.

17. The method according to claim 1, which further comprises forming the insulation region at least in part by local thermal oxidation of a material of the semiconductor substrate.

18. The method according to claim 1, which further comprises forming the insulation region at least in part by local thermal oxidation at least one of:
of silicon; and
as part of a LOCOS process.

19. The method according to claim 1, which further comprises forming the insulation region at least in part by a chemical reaction in the widened region.

20. The method according to claim 1, which further comprises forming the insulation region at least in part by etching a layer of microporous silicon in the widened region and subsequently partially oxidizing the layer.

21. The method according to claim 1, which further comprises forming the trench by:
forming the first trench section in the semiconductor substrate with a substantially anisotropic etching to form a the first temporary base region; and
then forming the protective region to cover at least one of wall regions and base regions of the first trench section.

22. The method according to claim 21, which further comprises:
removing the protective region beforehand at least in the first temporary base region.

23. The method according to claim 22, which further comprises removing the protective region with a substantially anisotropic etching step.

24. The method according to claim 1, which further comprises forming the third trench section by substantially anisotropic etching.

25. A method for fabricating a trench structure for an integrated semiconductor memory device, which comprises:
forming in a semiconductor substrate at least one trench extending at least in part substantially vertically with respect to the semiconductor substrate, the trench having a wall, and first, second and third trench sections; and forming an insulation region at least one of:
in a region of the wall,
and as part of the wall by:
forming the first trench section in the semiconductor substrate, the first trench section having a first wall region of the wall and a first temporary base region;
forming a protective region on regions of the first trench section not to be widened;
subsequently forming a widened region as the second trench section in at least one of a region of the first temporary base region and below the region of the first temporary base region, the second trench section having a second wall region of the wall and a secondary base temporary region;
subsequently forming the insulation region in at least one of a region of the second wall region and as part of the second wall region from a substantially electrically insulating material;

subsequently forming the third trench section adjoining the second trench section in at least one of a region of the second temporary base region and below the region of the second temporary base region.

26. A method for fabricating a trench structure for a DRAM, which comprises:

forming in a semiconductor substrate at least one trench extending at least in part substantially vertically with respect to the semiconductor substrate, the trench having a wall, and first, second and third trench sections; and forming an insulation region at least one of:
  in a region of the wall,
  and as part of the wall by:
    forming the first trench section in the semiconductor substrate, the first trench section having a first wall region of the wall and a first temporary base region;

forming a protective region on regions of the first trench section not to be widened;

subsequently forming a widened region as the second trench section in at least one of a region of the first temporary base region and below the region of the first temporary base region, the second trench section having a second wall region of the wall and a secondary base temporary region;

subsequently forming the insulation region in at least one of a region of the second wall region and as part of the second wall region from a substantially electrically insulating material;

subsequently forming the third trench section adjoining the second trench section in at least one of a region of the second temporary base region and below the region of the second temporary base region.

* * * * *